United States Patent
Makihata et al.

(10) Patent No.: US 7,904,123 B2
(45) Date of Patent: Mar. 8, 2011

(54) SHIELD CASE AND MEMS MICROPHONE HAVING IT

(75) Inventors: Katsuhiro Makihata, Kanagawa (JP); Norio Kimura, Kanagawa (JP)

(73) Assignee: Panasonic Corporation, Osaka (JP)

( * ) Notice: Subject to any disclaimer, the term of this patent is extended or adjusted under 35 U.S.C. 154(b) by 413 days.

(21) Appl. No.: 12/160,663

(22) PCT Filed: Sep. 13, 2007

(86) PCT No.: PCT/JP2007/067846
§ 371 (c)(1),
(2), (4) Date: Jul. 11, 2008

(87) PCT Pub. No.: WO2008/032785
PCT Pub. Date: Mar. 20, 2008

(65) Prior Publication Data
US 2010/0167799 A1 Jul. 1, 2010

(30) Foreign Application Priority Data
Sep. 15, 2006 (JP) .................. 2006-250915

(51) Int. Cl.
*H04M 1/00* (2006.01)
*H04R 9/08* (2006.01)

(52) U.S. Cl. .................................. 455/575.1; 381/361

(58) Field of Classification Search ............... 455/575.1, 455/550.1, 95, 558, 90.2, 90.3, 569.1; 381/190.174, 381/71.1, 91.1, 361, 151, 375
See application file for complete search history.

(56) References Cited

U.S. PATENT DOCUMENTS

| 2006/0006483 A1 | 1/2006 | Lee et al. |
| 2007/0217635 A1 | 9/2007 | Ogura et al. |

FOREIGN PATENT DOCUMENTS

| EP | 0 161 735 B1 | 11/1985 |
| JP | 60-208147 | 10/1985 |
| JP | 10-233828 | 9/1998 |
| JP | 2003-339088 | 11/2003 |
| JP | 2004-186276 | 7/2004 |
| JP | 2005-535152 | 11/2005 |
| JP | 2005-354377 | 12/2005 |
| JP | 2006-108589 | 4/2006 |
| JP | 2006-211468 A | 8/2006 |
| WO | WO 2005/086534 A1 | 9/2005 |

OTHER PUBLICATIONS

Japanese Notification of Reason for Refusal, w/ English translation thereof, issued in Japanese Patent Application No. JP 2006-250915 dated May 26, 2009.

*Primary Examiner* — Melody Mehrpour
(74) *Attorney, Agent, or Firm* — McDermott Will & Emery LLP (57) ABSTRACT

To provide a shield case and an MEMS microphone having the shield case which can secure on a top plate the minimum distance for adhering with a gasket in a view point of airtightness.
The shield case according to the invention is a shield case for shielding an MEMS chip mounted on a board from the outside, which includes a top plate and a plurality of side plates and the thickness of each of the plurality of side plates is larger than that of the top plate. According to this configuration, the area of the top plate can be made larger as compared with a conventional shield case having a uniform thickness. Thus, the area for adhering the gasket to the top plate can be secured without changing the position, size and range etc. of the chucking area from those of the conventional shield case.

39 Claims, 6 Drawing Sheets

SHIELD CASE AND MEMS MICROPHONE HAVING IT

RELATED APPLICATIONS

This application is the U.S. National Phase under 35 U.S.C. §371 of International Application No. PCT/JP2007/067846, filed on Sep. 13, 2007, which in turn claims the benefit of Japanese Application No. 2006-250915, filed on Sep. 15, 2006, the disclosures of which Applications are incorporated by reference herein.

TECHNICAL FIELD

The present invention relates to a shield case that covers an MEMS chip using the micro-machining technique utilizing the semiconductor technique. Further, the invention relates to an MEMS microphone and, more in detail, relates to an MEMS microphone having a shield case.

BACKGROUND ART

Conventionally, a shield case has been employed in order to protect electronic parts such as chips mounted on a board from electromagnetic wave noise or dust etc. from the outside.

Figure 6:
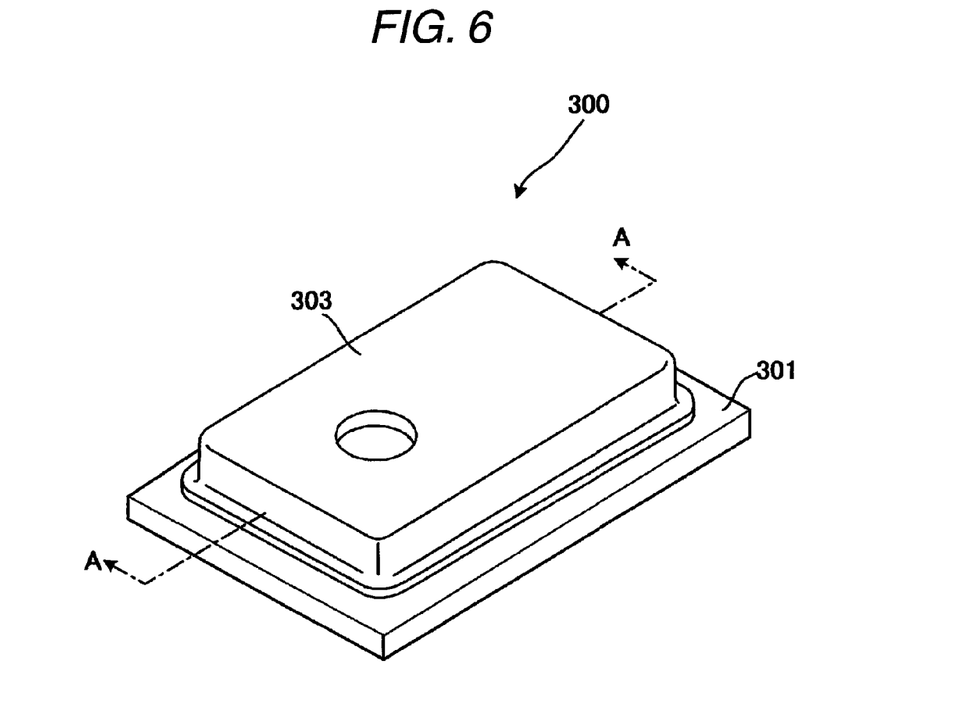
FIG. 6 is a perspective outside view of a conventional MEMS microphone.

FIG. 6 shows a perspective outside view of a conventional MEMS microphone. FIG. 7(a) is a side view of the conventional MEMS microphone. FIG. 7(b) is a plan view of the conventional MEMS microphone. FIG. 7(c) is a longitudinal sectional diagram (a sectional diagram along a line A-A in FIG. 6) of the conventional MEMS microphone.

Figure 7:
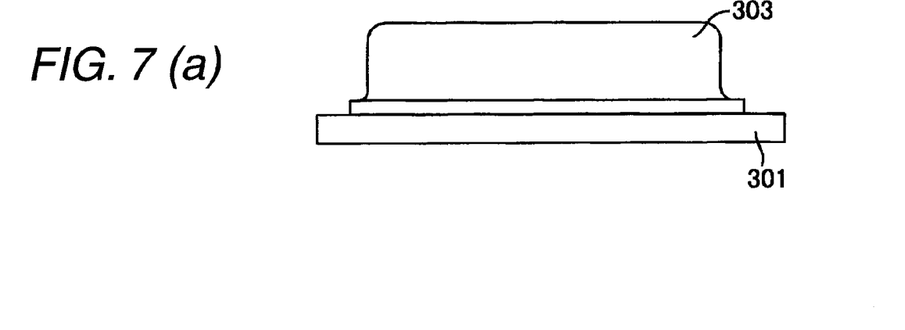

The conventional MEMS microphone 300 shown in FIGS. 6 and 7 is configured by a board 301, an MEMS chip 200 and a shield case 303. The MEMS chip 200 is a chip for converting a sound signal into an electric signal.

Such an MEMS microphone 300 is used in a state of being mounted on the main board of a mobile phone etc. In this case, in order to secure a passing path of the sound signal, the sound hole for the microphone of the casing in the mobile phone and a sound hole 303c on the top plate 303a of the shield case are disposed and mounted in an overlapped manner. However, even if the sound holes are disposed at an almost overlapping position, when there is a space between the casing and the shield case 303, the sound signal leaks from the space and so there arises a case that the acoustic characteristics designed in advance changes.

Thus, an improvement has been made that a gasket made of material such as rubber of silicon is adhered and sandwiched between the top plate 303a of the shield case and the casing of the mobile phone thereby to eliminate the space.

Further, similarly in a view point of the airtightness, a patent document 1 describes an example in which a gasket is pasted between a transparent panel plate and an external cover in the mechanism of the display portion of a mobile phone (see the patent document 1, for example).

Patent Document 1: JP-A-2005354377

DISCLOSURE OF THE INVENTION

Problems that the Invention is to Solve

In the case of employing the aforesaid method of filling the space by the gasket, in order to secure the airtightness, it is at least required to secure an area for adhering the gasket to the top plate 303a on the top plate 303a of the shield case. In other words, as shown in FIG. 7(b), minimum distances are at least required as distances L1, L2 between the sound hole 303c of the shield case and the end portions of the top plate 303a.

On the other hand, in the case of mounting the MEMS microphone 300 on the main board of a mobile phone etc., it is required to secure on the top plate 303a a chucking area S for picking up and placing the MEMS microphone 300. As shown in FIG. 7(b), the chucking area S is required to avoid the sound hole 303c on the top plate 303a of the shield case and have a constant area in order to prevent the failure of the MEMS chip 200. Further, in order to transport the MEMS microphone 300 stably, it is desirable to dispose the chucking area S near the center of gravity of the shield case as close as possible, that is, near the center of the top plate 303a.

In addition to the aforesaid circumstances, in recent years, the MEMS microphone 300 has been required to be further reduced in its size and thickness, and accordingly the shield case 303 has been reduced in its size and thickness. Accordingly, the area of the top plate 303a of the shield case has also been reduced, and hence it becomes difficult to secure the area for adhering the gasket while securing the area and location etc. for the chucking area S on the top plate.

To be concrete, the board 301 of the MEMS microphone is planed to have a size of 3 mm in the longitudinal direction and 4 mm in the transverse direction. When this size is employed, as the chucking area S, an area of at least 1.2 mm or more in each of the longitudinal and transverse directions is required to be secured in view of the weight of the shield case and the performance of a chucking device. Further, as shown in FIG. 7(b), the chucking area S is required to be disposed near the center of the top plate 303a of the shield case as close as possible.

Further, in order to secure the airtightness due to the sandwiching of the gasket, each of the distances L1, L2 from the sound hole 303c of the shield case to the end portions of the top plate 303a is required to be at least 1 mm or more. This distance is desirably as long as possible in a view point of the airtightness.

In this manner, when the area of the top plate is reduced in the case of miniaturizing the conventional shield case, it has become difficult to secure the distances from the sound hole 206 of the shield case to the end portions of the top plate 303a while securing the area and location for the chucking area S.

Further, in addition to the progress of the miniaturization, the uniform thinning of the shield case 303 has also been progressed within a range where the intensity of the shield case can be secured as a structure. As an example of the current thinnest shield case, there is one in which the thickness of each of the plate 303 and a side plate 303b is 0.1 mm. The shield case thus thinned is light-weighted and can secure a large size in each of the height, width etc. of an inner frame. However, since the end portions of the side plate are made small, the shield case is configured in a shape soldered hardly. Thus, when the end portions are merely fixed by the solder, the adhesive strength between the end portions and the board is weak.

Thus, as shown in FIG. 7(c), in the conventional uniformly thinned shield case, a bent portion 303d is provided at the end portions of the side plates 303b thereby to provide a space where a suitable amount of the solder is collected. A solder filet 303e is formed at a space formed by the bent portion 303d thereby to obtain the fixing intensity of the shield case.

However, the shield case 303 thinned uniformly in the aforesaid manner is required to have a size housed within the board 301 together with the bent portion 303d, and hence the size of the top plate 303a is made small by a size of the bent portion 303d.

Further, since the conventional shield case is usually formed by the squeezing processing and so a bent portion 303f formed by the end portion of the plate 303 and the side plate 303b is configured to have an R-shaped portion (round corner). Thus, the conventional shield case does not have a shape that can secure the area of the flat portion of the top plate to the maximum.

The invention has been made in view of the aforesaid problems and an object of the invention is to provide a shield case and an MEMS microphone having the shield case which can secure on a top plate the minimum distance for adhering with a gasket in a view point of airtightness without changing the position, size, range etc. of a chucking area on the top plate of a shield case, that is, while securing the area and position of the chucking area.

Means for Solving the Problems

The shield case according to the invention is a shield case for shielding an MEMS chip mounted on a board from outside, which includes a top plate and a plurality of side plates, wherein the thickness of each of the plurality of side plates is larger than the thickness of the top plate.

According to this configuration, the area of the top plate can be enlarged as compared with the conventional shield case having a uniform thickness. Thus, the area for adhering the gasket to the top plate can be secured without changing the position, size and range etc. of a chucking area from the conventional shield case.

Further, the shield case according to the invention is arranged in a manner that a bent portion formed by the end portion of the top plate and the side plate is formed to have a corner.

According to this configuration, the area of the flat portion of the top plate can be enlarged. The shield case according to the invention can be formed to have a corner portion by the hammering processing performed within a pressing mold, for example. The bent portion formed by the end portion of the top plate and the side plate can be formed to have an R of 0.05 or less, whereby the area of the flat portion of the top plate can be enlarged sufficiently and so the adhering property with the gasket can also be improved.

Further, the shield case according to the invention is arranged in a manner that each of end portions of the plurality of side plates has an R shaped portion toward the inside of the shield case.

According to this configuration, in the case of mounting the shield case by the reflow soldering processing, since solder enters into the space of the R-shaped portion to form a solder filet, the shield case can be firmly fixed to the board etc. with a suitable amount of the solder. The R-shaped portion desirably has an R of 0.1 or less, and so the space formed by the R-shaped portion can hold a sufficient amount of the solder.

The MEMS microphone according to the invention is arranged to include a board; an MEMS chip mounted on the board; and a shield case, for shielding the MEMS chip from outside, which includes a top plate and a plurality of side plates, wherein the thickness of each of the plurality of side plates is larger than the thickness of the top plate.

According to this configuration, the area of the top plate of the shield case can be enlarged as compared with the conventional shield case having a uniform thickness. Thus, the distance for adhering the gasket to the top plate can be secured to be long without changing the position, size and range etc. of the chucking area from the conventional shield case.

Further, the MEMS microphone according to the invention is arranged in a manner that a bent portion formed by the end portion of the top plate and the side plate of the shield case is formed to have a corner.

According to this configuration, the area of the flat portion of the top plate of the shield case covering the MEMS chip can be enlarged.

Further, the MEMS microphone according to the invention is arranged in a manner that each of the end portions of the plurality of side plates has an R shaped portion toward inside of the shield case.

According to this configuration, in the case of mounting the shield case by the reflow soldering processing etc., since solder enters into the space of the R-shaped portion to form a solder filet, the shield case can be firmly fixed to the board with a suitable amount of the solder.

Effects of the Invention

According to the invention, since the area of the top plate can be enlarged, the area for adhering the gasket to the top plate can be secured without changing the position, size and range etc. of the chucking area from the conventional shield case.

BRIEF DESCRIPTION OF THE DRAWINGS

FIG. 3(a) is a side view of the MEMS microphone 100, (b) is a plan view of the MEMS microphone 100, (c) is a sectional view along a line C-C in FIGS. 3(b), and (d) is a sectional view along a line D-D in FIG. 3(b).

FIG. 7(a) is a side view of the conventional MEMS microphone, (b) is a plan view of the conventional MEMS microphone, and (c) is a longitudinal sectional diagram (a sectional diagram along a line A-A in FIG. 6) of the conventional MEMS microphone.

EXPLANATION OF SIGNS

100 MEMS microphone
101 board
102 MEMS chip
103 shield case
103a top plate
103b side plate
103c sound hole
103d R-shaped portion
103e solder filet
103f bent portion
150 mobile phone
151 casing
152 sound hole on casing
154 gasket
155 main board of mobile phone

BEST MODE FOR CARRYING OUT THE INVENTION

First Embodiment

Figure 1:
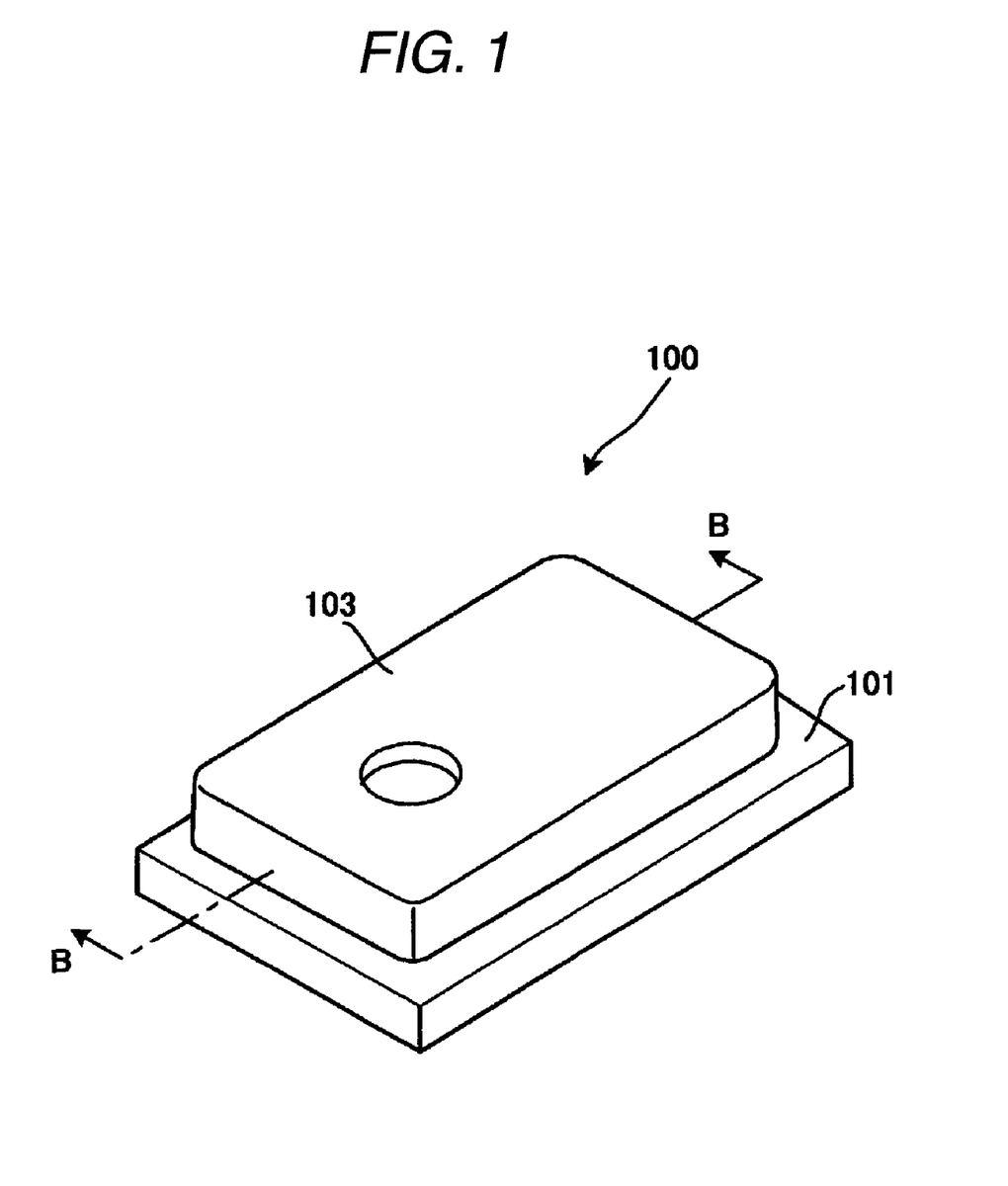
FIG. 1 is a perspective outside view of an MEMS microphone 100 according to the first embodiment.
Figure 2:
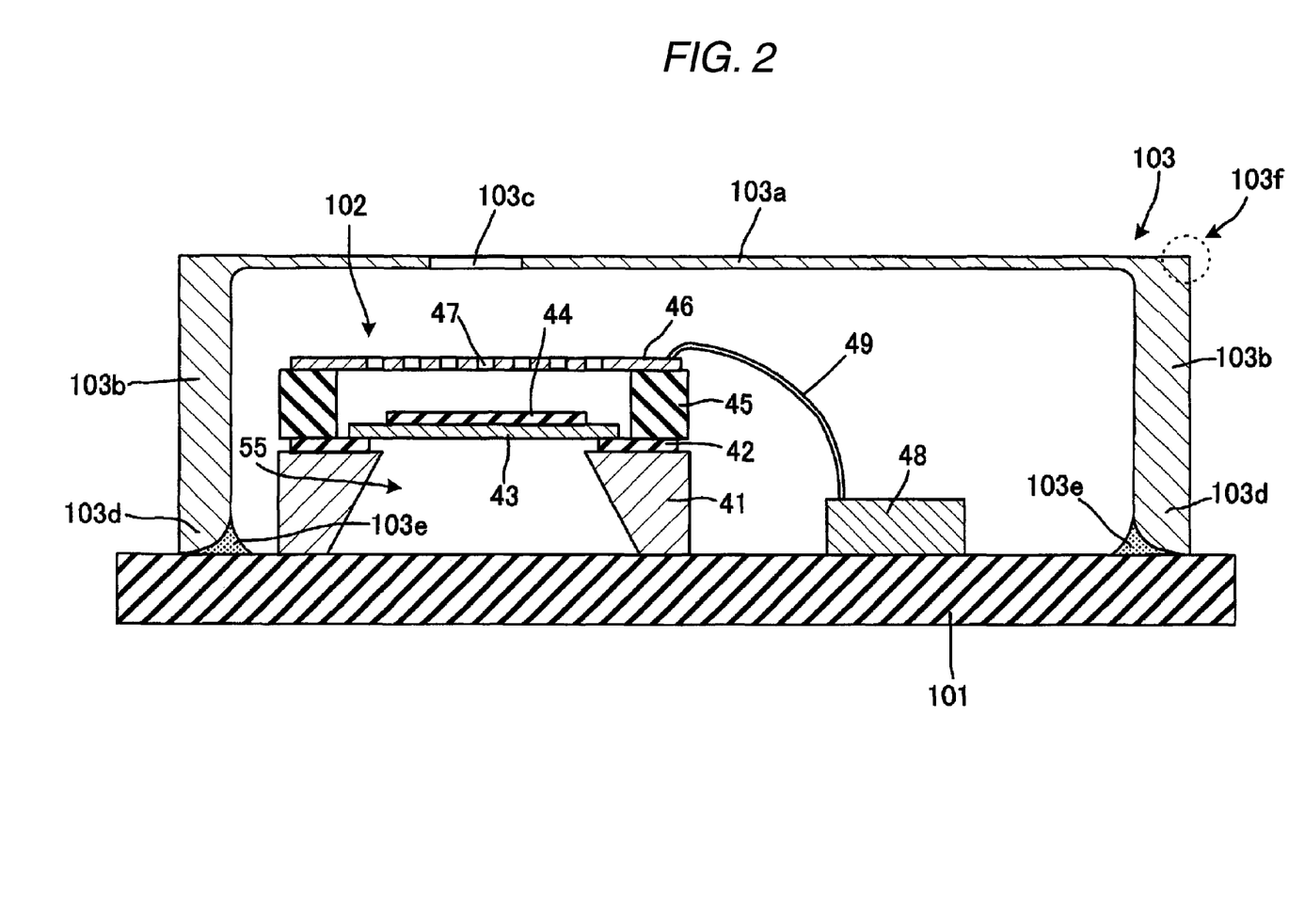
FIG. 2 is a longitudinal sectional view (a sectional diagram along a line B-B of FIG. 1) of the MEMS microphone 100.

FIG. 1 shows a perspective outside view of an MEMS microphone 100 according to the first embodiment. FIG. 2 shows a longitudinal sectional view (a sectional diagram along a line B-B of FIG. 1) of the MEMS microphone 100. As shown in FIGS. 1 and 2, the MEMS microphone 100 includes a board 101, an MEMS chip 102 and a shield case 103 and is characterized in that the thickness of each of a plurality of side plates 103b constituting the shield case 103 is larger than that of a top plate 103a.

The board 101 is a printed board for mounting the MEMS chip 102 thereon. The size of the mounting surface of the board 101 is 3 mm in the longitudinal direction and 4 mm in the transverse direction, for example.

As shown in FIG. 2, the MEMS chip 102 converts a sound signal obtained from a vibration film electrode 43 into an electric signal. To be concrete, the MEMS chip 102 includes the vibration film electrode 43 and an electret film 44 via a first insulation layer 42 on the silicon board 41 and further includes a fixed electrode 46 provided with a sound hole 47 via a second insulation layer 45 on the first insulation layer. Further, a back air chamber 55 is formed on the rear surface of the vibration film electrode 43 by etching the silicon board 41. MEMS (Micro Electro Mechanical System) means an electromechanical system configured by fine parts which are fabricated by using the micro fabrication technique for a semiconductor.

The vibration film electrode 43 is formed by conductive polysilicon. The electret film 44 is formed by a silicon nitride film or a silicon oxide film. By laminating conductive polysilicon and a silicon oxide film or a silicon nitride film, the fixed electrode 46 is formed.

An amplifying circuit 48 for amplifying the electric signal from the MEMS chip 102 is electrically coupled by a wire. The MEMS chip 102 and the amplifying circuit 48 are covered by the shield case 103.

Figure 3:
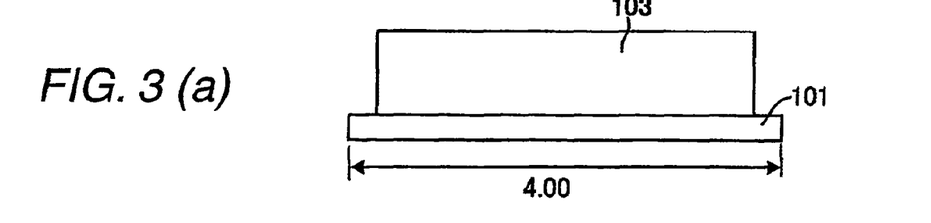

Next, the explanation will be made as to the shield case 103. FIG. 3(a) is a side view of the MEMS microphone 100. FIG. 3(b) is a plan view of the MEMS microphone 100. FIG. 3(c) is a sectional view along a line C-C in FIG. 3(b). FIG. 3(d) is a sectional view along a line D-D in FIG. 3(b). In each diagram of FIG. 3, the MEMS chip 102 is not shown.

As shown in each diagram, the shield case 103 is configured by a top plate 103a of an almost rectangular shape having four round corners and four side plates 103b. The material of the shield case is metal having the electric shield property such as nickel silver (alloy formed by copper, lead and nickel), kovar or 42 alloy. The shield case may be subjected to the surface processing such as Ni plating in order to join with a board by the soldering etc. The thickness of the top plate 103a is 0.1 mm and the thickness of each of the side plates 103b is 0.25 mm. The shield case 103 has a different thickened structure in which the side plate 103b has a larger thickness than the top plate 103a. Further, the end portion 103f of the top plate 103a is formed to have a corner portion. The shield case 103 can be configured in a shape having corner portions by the hammering processing performed within a pressing mold, for example. The corner of the end portion 103f of the top plate 103a according to the invention is formed to have an R of 0.05 or less. On the other hand, the corner of the end portion according to the conventional squeezing processing is formed to have an R of 0.2 or less. The shape of the corner may have the R smaller (radius of a circle is smaller) than that of the shape of the corner of the bent portion formed by the conventional squeezing processing.

According to this configuration, since the bent portion formed by the end portion of the top plate and the side plate is not formed to have a relatively large R like the conventional shield case but formed to have a corner, that is, a small R, the flat portion of the top plate is enlarged by an amount corresponding to the thickness of the side plate. Further, the area of the top plate is enlarged by an amount corresponding to the enlarged thickness of the side plate. Thus, in the design of the top plate of the shield case, the area to be adhered to the gasket can be secured and also the chucking area can be secured.

That is, for example, the top plate 103a of the shield case according to the first embodiment includes the sound hole 103c having a diameter of 0.6 mm. In the top plate 103a of the shield case, the chucking area S is secured at the position not overlapping with the sound hole 103c. The chucking area S is set to have a size of 1.2 mm in each of the longitudinal and transverse directions and is disposed in a manner that the center portion thereof locates near the center portion of the top plate 103a of the shield case. Since the corner is formed at each of the end portions of the top plate and the side plate is configured in the different thickened structure thereby to enlarge the area of the flat portion of the top plate 303a, it becomes possible to dispose the sound hole 103c at the position not overlapping with the chucking area S and further at such a position that the distances L1, L2 from the sound hole 103c to the end portions of the top plate 103a are 1 mm or more. Since the shield case is formed in a manner that a single plate is processed so as to have different thicknesses, then the plate is subjected to the forming processing within the pressing mold and subjected to the hammering processing within the pressing mold, the side plate is formed to have a larger thickness than the top plate and have the small R.

Further, the side plates 103b of the shield case are formed at the end portions of the respective sides of the top plate 103a of the rectangular shape, respectively. The shield case 103 is formed by the top plate 103a and the four side plates 103b and is configured in a lid shape of an almost rectangular shape. The end portion of the side plate 103b is processed so as to have an R-shaped portion 103d toward the inside of the shield case 103.

According to the aforesaid configuration, in the case of mounting the shield case 103 on the board 101 by the reflow soldering processing etc., since the solder enters into the space of the R-shaped portion 103d to form a solder filet 103e as shown in FIG. 2, the shield case can be firmly fixed to the board with a suitable amount of the solder. Conventionally, since the R-shaped portion has an R of about 0.15, the space of the R-shaped portion 103d can not hold a sufficient amount of the solder. However, since the R-shaped portion of the embodiment has an R of 0.1 or less, the space of the R-shaped portion 103d can hold a sufficient amount of the solder.

Although the first embodiment is explained as to the case where the shield case is configured in the rectangular lid shape, the shape of the shield case is not limited thereto and may be modified in accordance with the shape of the board. For example, when the board 101 has a circular shape, the top plate of the shield case 103 also may be configured in a circular shape. Further, when the board 101 has a polygonal shape, the top plate of the shield case 103 also may be configured in a polygonal shape.

Second Embodiment

Figure 4:
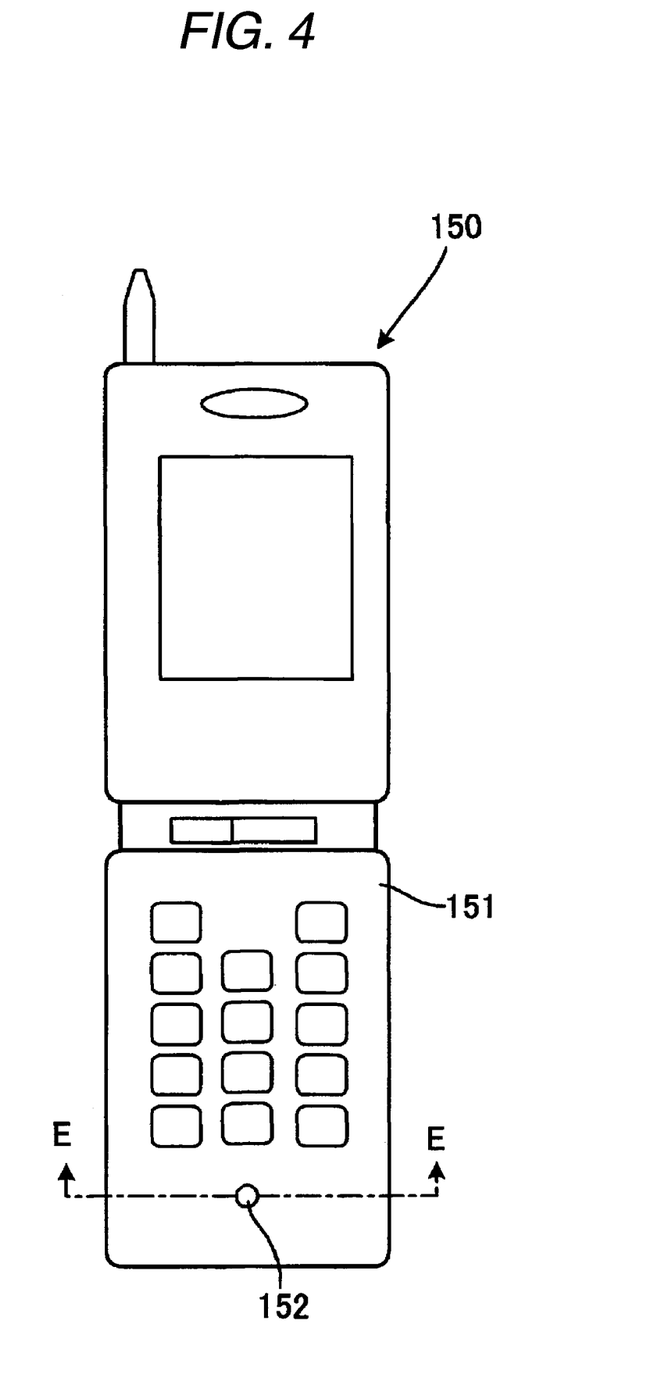
FIG. 4 is a perspective outside view of a mobile phone 150 in which the MEMS microphone 100 is mounted.
Figure 5:
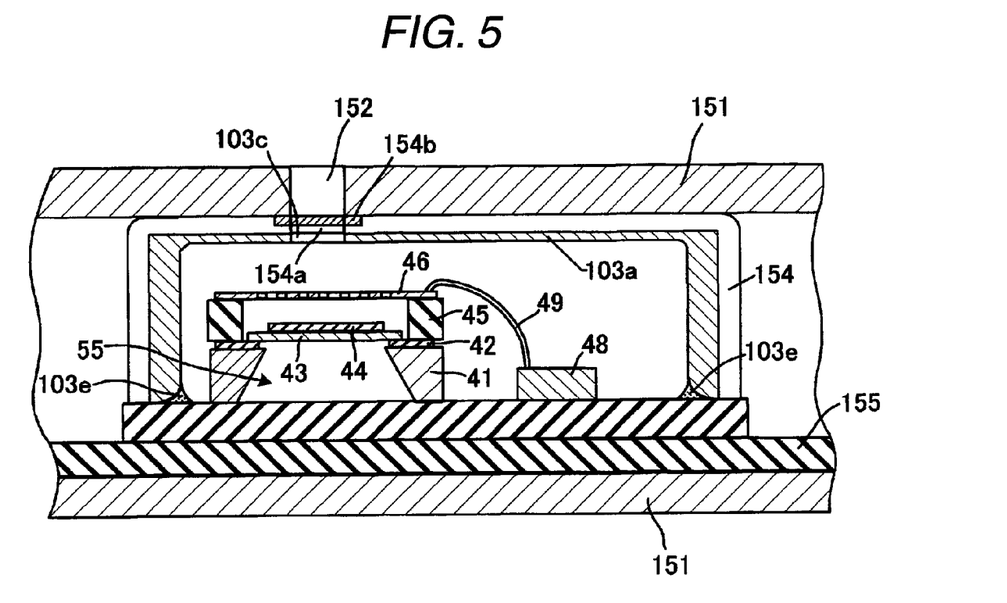
FIG. 5 is a sectional view of a main portion (sectional view along a line E-E in FIG. 4) near the microphone portion of the mobile phone 150.

Next, the explanation will be made as to a case where the MEMS microphone 100 is used for a mobile phone. FIG. 4 is a perspective outside view of a mobile phone 150 in which the MEMS microphone 100 is mounted. FIG. 5 is a sectional view of a main portion (sectional view along a line E-E in FIG. 4) near the microphone portion of the mobile phone 150.

In the casing 151 of the mobile phone 150 shown in FIG. 4, a sound hole 152 for the microphone is formed at a position corresponding to near the mouth of a user in use.

A gasket 154 is sandwiched between the top plate 103a of the shield case of the MEMS microphone 100 and the inner side surface of the casing 151. Like the shield case of the first embodiment, this shield case 103 is also characterized in that the thickness of the side plate 103b is larger than that of the top plate 103a. As shown in FIG. 5, the sound hole 152 of the casing 151 has almost the same shape as the sound hole 103c of the shield case, and these sound holes are formed so as to be overlapped to each other after the assembling.

The gasket 154 is also provided with a hole 154a having almost the same shape as the sound hole 103c. An acoustic resistance material 154b is formed at the end portion on the casing side of the hole 154a. The acoustic resistance material 154b serves to reduce the propagation speed of the sound signal and in this case acts to adjust the acoustic characteristics of the MEMS microphone 100.

The thickness of the gasket 154 is slightly larger than the space between the top plate 103a and the inner side surface of the casing 151, and so the gasket is sandwiched in a closely adhered state from the sound hole 103c to each of the end portions of the top plate 103a of the shield case.

That is, as the area for sandwiching the gasket 154, the distances L1, L2 from the sound hole 103c to the respective end portions of the top plate 103a of the shield case are designed to be 1 mm or more, the airtightness after sandwiching the gasket 154 can be secured.

Accordingly, since the sound signal entering from the sound hole 152 of the casing does not leak into the space between the top plate 103a and the inner side surface of the casing 151, the acoustic characteristics of the MEMS microphone 100 can not be degraded.

Sound entered from the sound hole 152 of the casing passes the acoustic resistance material 154b and propagated to the vibration film electrode 43 of the MEMS chip. Thus, the electrostatic capacity of a plate capacitor configured by the vibration film electrode 43 and the fixed electrode 46 changes and so the sound is taken out as a voltage change between the vibration film electrode 43 and the fixed electrode 46.

The MEMS microphone 100 is enlarged in the area of the top plate by employing the different thickened structure at the shield case 103, whereby the problem of the sound leak at the gasket can be solved. Thus, the miniaturized MEMS microphone 100 can be mounted on a mobile phone, which contributes to the miniaturization and thinning of the entire shape of the mobile phone 150.

Further, since the shield case 103 has the different thickened structure in which the thickness of the side plate has a larger thickness than the top plate, the position of the center of the gravity is stable as compared with a shield case having a uniform thickened structure. Thus, in the assembling process, when a chucking device chucks the chucking area of the shield case 103 and transports the MEMS microphone 100, the microphone can be transported stably. In other words, a process of transporting the MEMS microphone 100 to the mounting position of the main board 155 of the mobile phone 150 can be performed surely and stably.

INDUSTRIAL APPLICABILITY

According to the invention, since the area of the top plate of the shield case can be enlarged, the invention is useful as the shield case and the MEMS microphone having the shield case which can secure the area for adhering the gasket to the top plate without changing the position, size and range etc. of the chucking area from the conventional ones.

The invention claimed is:

1. A MEMS microphone, comprising:
   a board;
   a MEMS chip mounted on the board; and
   a shield case formed over the mounted MEMS chip, the shield case having a top plate and a side plate,
   wherein a thickness of the side plate is larger than a thickness of the top plate, and a center of the gravity of the shield case is lower than that of a shield case having a top plate and a side plate of the same thickness.

2. The MEMS microphone according to claim 1 wherein an end portion of the side plate is attached on a surface of the board on which the MEMS chip is mounted.

3. The MEMS microphone according to claim 1, wherein a bent portion formed by an end portion of the top plate and an end portion of the side plate is formed to have a corner.

4. The MEMS microphone according to claim 1, wherein an end portion of the side plate has a R shaped portion toward inside of the shield case.

5. The MEMS microphone according to claim 2, wherein the end portion of the side plate has a R shaped portion toward inside of the shield case.

6. The MEMS microphone according to claim 3, wherein the other end portion of the side plate has a R shaped portion toward inside of the shield case.

7. The MEMS microphone according to claim 4, wherein a solder is formed between the R shaped portion of the end portion of the side plate and the board.

8. MEMS microphone according to claim 5, wherein a solder is formed between the R shaped portion of the other end portion of the side plate and the board.

9. The MEMS microphone according to claim 6, wherein a solder is formed between the R shaped portion of the other end portion of the side plate and the board.

10. The MEMS microphone according to claim 1, wherein an end portion of the top plate has a corner and a flat portion of the top plate is on the side plate.

11. The MEMS microphone according to claim 1, wherein the shield case has a Ni plating.

12. The MEMS microphone according to claim 2, wherein the shield case has a Ni plating.

13. The MEMS microphone according to claim 4, wherein the shield case has a Ni plating.

14. The MEMS microphone according to claim 1, wherein a thickness of the top plate is 0.1 mm and a thickness of the side plate is 0.25 mm.

15. The MEMS microphone according to claim 2, wherein a thickness of the top plate is 0.1 mm and a thickness of the side plate is 0.25 mm.

16. The MEMS microphone according to claim 4, wherein a thickness of the top plate is 0.1 mm and a thickness of the side plate is 0.25 mm.

17. The MEMS microphone according to claim 1, wherein the top plate has a sound hole and a distance from the sound hole to an end portion of the top plate is 1 mm or more.

18. The MEMS microphone according to claim 1, wherein a size of a mounting surface of the board is 3×4 mm or less.

19. The MEMS microphone according to claim 2, wherein a size of a mounting surface of the board is 3×4 mm or less.

20. The MEMS microphone according to claim 4, wherein a size of a mounting surface of the board is 3×4 mm or less.

21. The MEMS microphone according to claim 7, wherein a size of a mounting surface of the board is 3×4 mm or less.

22. The MEMS microphone according to claim 14, wherein a size of a mounting surface of the board is 3×4 mm or less.

23. The MEMS microphone according to claim 14, wherein a size of a mounting surface of the board is 3×4 mm or less.

24. The MEMS microphone according to claim 18, wherein the top plate has a sound hole and a distance from the sound hole to an end portion of the top plate is 1 mm or more.

25. The MEMS microphone according to claim 19, wherein the top plate has a sound hole and a distance from the sound hole to an end portion of the top plate is 1 mm or more.

26. The MEMS microphone according to claim 20, wherein the top plate has a sound hole and a distance from the sound hole to an end portion of the top plate is 1 mm or more.

27. The MEMS microphone according to claim 21, wherein the top plate has a sound hole and a distance from the sound hole to an end portion of the top plate is 1 mm or more.

28. The MEMS microphone according to claim 22, wherein the top plate has a sound hole and a distance from the sound hole to an end portion of the top plate is 1 mm or more.

29. The MEMS microphone according to claim 23, wherein the top plate has a sound hole and a distance from the sound hole to an end portion of the top plate is 1 mm or more.

30. The MEMS microphone according to claim 1, wherein the top plate and the side plate are single-piece and the top plate and the side plate comprise metal.

31. The MEMS microphone according to claim 4, wherein the top plate and the side plate are single-piece and the top plate and the side plate comprise metal.

32. The MEMS microphone according to claim 14, wherein the top plate and the side plate are single-piece and the top plate and the side plate comprise metal.

33. The MEMS microphone according to claim 18, wherein the top plate and the side plate are single-piece and the top plate and the side plate comprise metal.

34. The MEMS microphone according to claim 24, wherein the top plate and the side plate are single-piece and the top plate and the side plate comprise metal.

35. A mobile phone comprising:
a case; and
a MEMS microphone comprising a board, a MEMS chip mounted on the board and a shield case, formed over the mounted MEMS chip, the shield case having a top plate and a side plate,
wherein a thickness of the side plate is larger than a thickness of the top plate, and a center of the gravity of the shield case is lower than that of a shield case having a top plate and a side plate of the same thickness.

36. The mobile phone according to claim 35, wherein an end portion of the side plate is attached on a surface, of the board on which the MEMS chip is mounted.

37. The mobile phone according to claim 35, wherein a gasket is secured between the MEMS microphone and the case.

38. The mobile phone according to claim 35, wherein a sound hole of the top plate and a sound hole of the case are connected.

39. The mobile phone according to claim 35, wherein an acoustic resistance material is formed between a sound hole of the top plate and a sound hole of the case.

* * * * *